United States Patent
Haeusler et al.

(10) Patent No.: US 7,118,981 B2
(45) Date of Patent: Oct. 10, 2006

(54) METHOD OF FABRICATING AN INTEGRATED SILICON-GERMANIUM HETEROBIPOLAR TRANSISTOR AND AN INTEGRATED SILICON-GERMANIUM HETEROBIPOLAR TRANSISTOR

(75) Inventors: Alfred Haeusler, Freising (DE); Philipp Steinmann, Richardson, TX (US); Scott Balster, Munich (DE); Badih El-Kareh, Wang (DE)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 10/824,745

(22) Filed: Apr. 15, 2004

(65) Prior Publication Data

US 2005/0001236 A1    Jan. 6, 2005

(30) Foreign Application Priority Data

May 27, 2003    (DE) ................. 103 24 065

(51) Int. Cl.
*H01L 21/331*    (2006.01)
*H01L 21/8222*    (2006.01)

(52) U.S. Cl. ............ 438/312; 438/359; 438/318; 438/320; 438/357; 438/341; 438/366; 257/E21.371; 257/E21.335; 257/E21.703

(58) Field of Classification Search ........ 438/312, 438/235, 310–320, 357, 359, 341, 366; 257/E21.371, 257/E21.335
See application file for complete search history.

(56) References Cited

U.S. PATENT DOCUMENTS 4,672,413 A    6/1987    Gardner
5,089,428 A *  2/1992    Verret et al. ............. 438/312
5,296,388 A *  3/1994    Kameyama et al. ...... 438/370
5,616,515 A *  4/1997    Okuno .................... 438/478
6,080,631 A *  6/2000    Kitahata .................. 438/341
6,365,479 B1 * 4/2002    U'Ren ..................... 438/320
6,410,395 B1 * 6/2002    Terpstra et al. .......... 438/312
6,459,104 B1 * 10/2002   Schuegraf ................ 257/197
6,509,242 B1 * 1/2003    Frei et al. ................ 438/312
6,638,819 B1 * 10/2003   Joshi et al. .............. 438/256
6,709,941 B1 * 3/2004    Fujimaki ................. 438/341
6,787,879 B1 * 9/2004    Joshi et al. .............. 257/565

FOREIGN PATENT DOCUMENTS

| DE | 690 22 692 T2 | 3/1996 |
| DE | 197 52 052 A1 | 8/1998 |
| EP | 881669 A1 * | 12/1998 |
| WO | WO 02/41361 A2 | 5/2002 |
| WO | WO 2005088721 A1 * | 9/2005 |

* cited by examiner

*Primary Examiner*—B. William Baumeister
*Assistant Examiner*—Igwe U. Anya
(74) *Attorney, Agent, or Firm*—Jacqueline J. Garner; W. James Brady, III; Frederick J. Telecky, Jr.

(57) ABSTRACT

In a method of fabricating an integrated silicon-germanium heterobipolar transistor a silicon dioxide layer arranged between a silicon-germanium base layer and a silicon emitter layer is formed by means of Rapid Thermal Processing (RTP) to ensure enhanced component properties of the integrated silicon-germanium heterobipolar transistor.

19 Claims, No Drawings

METHOD OF FABRICATING AN INTEGRATED SILICON-GERMANIUM HETEROBIPOLAR TRANSISTOR AND AN INTEGRATED SILICON-GERMANIUM HETEROBIPOLAR TRANSISTOR

FIELD OF THE INVENTION

The present invention relates to a method of fabricating an integrated silicon-germanium heterobipolar transistor wherein between a silicon-germanium base layer and a silicon emitter layer a silicon dioxide layer is formed. The present invention relates furthermore to an integrated silicon-germanium heterobipolar transistor comprising a silicon-germanium base layer, a silicon emitter layer and a silicon dioxide layer.

BACKGROUND OF THE INVENTION

Silicon-germanium heterobipolar transistors in which the base electrodes are formed by a silicon-germanium layer feature substantially higher cut-off frequencies than transistors fabricated by conventional methods, since the injection of germanium atoms into the base layers of the transistors reduces the band gap energy. The silicon-germanium base layer is normally applied either by implantation or, like the emitter layer thereabove, by epitaxial growth. Provided between the silicon-germanium base layer and the emitter layer is a silicon dioxide layer. The oxide of the silicon dioxide layer is normally produced by thermal oxidation of silicon in tube furnaces in which batches of up to 200 wafers are oxidized simultaneously. The thermal inertia of these furnaces necessitates lengthy processing, resulting in the wafers being maintained at very high temperatures for a relatively long time. The electronic properties of bipolar transistors are determined, among other things, by the properties of this silicon dioxide layer.

SUMMARY OF THE INVENTION

The present invention provides a method of fabricating an integrated silicon-germanium heterobipolar transistor which ensures enhanced component properties of the silicon-germanium heterobipolar transistors fabricated thereby.

In accordance with the invention the silicon dioxide layer is formed by means of Rapid Thermal Processing (RTP) in which the individual wafers are heated by means of a cluster of high-power lamps to several hundred degrees centigrade within a few seconds in a vacuum or inert gas atmosphere and are cooled very quickly subsequently. Exposing the heated wafer to an oxygenated atmosphere causes an oxide layer to be formed. As compared to conventional thermal oxidation in tube furnaces RTP permits the formation of thinner, denser and smoother oxide layers. Silicon-germanium bipolar transistors in which the silicon dioxide layer between the base layer and the emitter layer is formed by means of RTP feature higher breakdown voltages and higher current gain than conventional silicon-germanium bipolar transistors.

The present invention furthermore provides an integrated silicon-germanium heterobipolar transistor comprising enhanced component properties.

For this purpose in accordance with the invention there is provided between the silicon-germanium base layer and the silicon emitter layer a silicon dioxide layer obtained by RTP. The integrated silicon-germanium heterobipolar transistors in accordance with the invention exhibit higher breakdown voltages and higher current gain than silicon-germanium bipolar transistors comprising a silicon dioxide layer between the base and emitter as obtained by conventional thermal oxidation in tube furnaces.

Further features and advantageous aspects of the invention read from the subclaims.

DETAILED DESCRIPTION OF THE EMBODIMENTS

The invention will now be detailed by way of a preferred example embodiment of a method for fabricating an integrated silicon-germanium heterobipolar transistor.

A wafer on which a silicon-germanium base layer has already been formed for a heterobipolar transistor is transferred via a transfer chamber into a process chamber, the so-called Rapid Thermal Oxidation (RTO) chamber. Both chambers have been flooded with high-purity nitrogen, both chambers being pressurized to approximately 660 Pa. When the wafer is in the RTO chamber further nitrogen is introduced into the RTO chamber until normal pressure (101325 Pa) exists in the chamber. In a first temperature step, the wafer is then heated to a temperature between 350° C. and 500° C., after which the wafer is heated relatively quickly in a second temperature step to 640° C. "Relatively quickly" in this context means increasing the temperature by 40° C. to 100° C. per second. In a third temperature step, the wafer is subsequently heated relatively slowly to a temperature of 705° C. "Relatively slowly" in this context means increasing the temperature by 10° C. to 40° C. per second. The attained temperature of 705° C. represents the process temperature for forming a silicon dioxide layer. For this purpose, the wafer is exposed to an oxygen-nitrogen atmosphere in the chamber for 10 seconds, the oxygen-nitrogen atmosphere preferably being formed for this purpose by 10 percentage by weight oxygen in nitrogen. Subsequently, the wafer is cooled in a high-purity nitrogen atmosphere, and the chamber is pumped down to a pressure of 660 Pa. The wafer is then transferred from the RTO chamber via the transfer chamber in which the pressure is also 660 Pa into a cooling chamber. In the cooling chamber also exists a pressure of 660 Pa. Here, the wafer is cooled for the duration of 30 seconds. Subsequently, the wafer is unloaded via a load/unload chamber. To transfer the wafer from the cooling chamber into the load/unload chamber substantially the same pressure exists in the latter as in the cooling chamber. Once the wafer is then in the load/unload chamber which is closed off gas-tight from the cooling chamber by means of a valve, the load/unload chamber is opened and the wafer can be removed. For loading of the RTO chamber a new wafer can then be introduced into the load/unload chamber which is then flooded with high-purity nitrogen and subsequently pumped down by a suitable pump to the pressure existing in the transfer chamber.

The oxide layer formed by the RTP method as described above has a thickness of approximately 0.35 nm.

It is understood that the method as described for fabricating an integrated silicon-germanium heterobipolar transistor is to be viewed as being merely a preferred example embodiment, other RTP techniques employing other process temperatures and pressures also being covered by the invention for the fabrication of a silicon dioxide layer. In a preferred variant of the method, the base layer is heated in a sequence of temperature steps to a process temperature at which the silicon dioxide layer is subsequently formed.

In this method, it is of advantage when the properties of the silicon dioxide layer are monitored by means of suitable methods during growth.

In accordance with a preferred method, following formation of the silicon dioxide layer, the emitter layer is grown epitaxially in a process chamber of the same device in thus avoiding contaminations at the exposed silicon dioxide/emitter interface. The emitter layer may be grown, for example, from polycrystalline silicon.

In accordance with another preferred method, it is furthermore provided for that prior to forming the silicon dioxide layer in the RTO chamber a pre-cleaning step in a further chamber of the same device is implemented. With the pre-cleaning step, for example, the silicon dioxide having grown during wet-cleaning of the surface of the silicon-germanium base layer can be partly or even fully removed. For pre-cleaning, the wafer may be exposed for a predetermined time at a reduced pressure to a reducing atmosphere, e.g. hydrogen. Since pre-cleaning takes place in the same device as subsequent application of the very thin silicon dioxide layer, surface contaminations can be avoided or minimized.

As compared to conventional thermal oxidation in tube furnaces RTP permits the formation of thinner, denser and smoother oxide layers. Silicon-germanium bipolar transistors, in which the silicon dioxide layer is configured between the base layer and the emitter layer by means of RTP, feature higher breakdown voltages and higher current gain than conventional silicon-germanium bipolar transistors in which the silicon dioxide layer is formed by conventional thermal oxidation in tube furnaces.

The method in accordance with the invention finds application preferably in the fabrication of pnp-silicon-germanium heterobipolar transistors.

The invention claimed is:

1. A method of fabricating an integrated silicon-germanium heterobipolar transistor wherein between a silicon-germanium base layer and a silicon emitter layer a silicon dioxide layer is formed, characterized in that said silicon dioxide layer is formed by means of Rapid Thermal Processing (RTP), wherein said base layer is heated in a sequence of temperature steps to a process temperature at which said silicon dioxide layer is subsequently formed and wherein in a first temperature step said base layer is heated to a temperature between 350° C. and 500° C.

2. The method as set forth in claim 1 wherein said silicon dioxide layer and said emitter layer are formed by means of a single continual process.

3. The method as set forth in claim 1 wherein said base layer is heated in a second temperature step to approximately 640° C.

4. The method as set forth in any of the claims 3 wherein said base layer 15 is heated in a third temperature step to approximately 705° C.

5. The method as set forth in claim 1 wherein said base layer is heated in a nitrogen atmosphere.

6. The method as set forth in claim 1 wherein said base layer 20 is exposed to an oxygen-nitrogen atmosphere for approximately 10 seconds.

7. The method as set forth in claim 1 wherein said silicon dioxide layer has a thickness between 0.3 nm and 0.4 nm, preferably approximately 0.35 nm.

8. The method as set forth in claim 1 wherein said silicon-germanium heterobipolar transistor is a pnp-bipolar transistor.

9. The method as set forth in claim 1 wherein an emitter layer is formed of polysilicon.

10. The method as set forth in claim 1 wherein the properties of said silicon dioxide layer are monitored during said RTP.

11. The method as set forth in claim 1 wherein the surface of said silicon-germanium base layer is pre-cleaned and said silicon dioxide layer is subsequently formed in a single continual process.

12. A method of fabricating an integrated circuit comprising the steps of:
    forming a silicon-germanium base layer on a wafer;
    transferring the silicon-germanium base layer to a Rapid Thermal Oxidation (RTO) chamber;
    heating the silicon-germanium base layer using a sequence of temperature steps in the RTO chamber;
    forming a silicon dioxide layer over the silicon-germanium base layer in said RTO chamber
    transferring the silicon-germanium base layer from the RTO chamber after forming the silicon dioxide layer; and
    forming a silicon emitter layer over the silicon dioxide layer.

13. The method of claim 12, wherein said sequence of temperature steps comprises:
    a first temperature step heating to a first temperature;
    a second temperature step heating to a second temperature higher than said first temperature; and
    a third temperature step heating to a third temperature higher than said second temperature.

14. The method of claim 13, wherein said first temperature is in the range of 350° C. to 500° C.

15. The method of claim 13, wherein said second temperature step comprises relatively quickly heating to the second temperature.

16. The method of claim 13, wherein the second temperature is approximately 640° C.

17. The method of claim 13, wherein said third temperature step comprises relatively slowly heating to the third temperature.

18. The method of claim 13, wherein the third temperature is approximately 705° C.

19. The method of claim 12, wherein said sequence of temperature steps comprises:
    heating to a first temperature in the range of 350° C. to 500° C.;
    relatively quickly heating to a second temperature higher than the first temperature; and
    relatively slowly heating to a third temperature higher than said second temperature.

* * * * *